(12) United States Patent
Takizawa

(10) Patent No.: US 8,848,457 B2
(45) Date of Patent: Sep. 30, 2014

(54) SEMICONDUCTOR STORAGE DEVICE AND DRIVING METHOD THEREOF

(75) Inventor: Ryosuke Takizawa, Ninomiya-machi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 13/602,036

(22) Filed: Aug. 31, 2012

(65) Prior Publication Data

US 2013/0242684 A1 Sep. 19, 2013

(30) Foreign Application Priority Data

Mar. 16, 2012 (JP) .................................. 2012-60707

(51) Int. Cl.
*G11C 8/14* (2006.01)
(52) U.S. Cl.
USPC .................................................... 365/189.02
(58) Field of Classification Search
CPC ........................................................ G11C 8/14
USPC .................................................... 365/189.02
See application file for complete search history.

(56) References Cited

U.S. PATENT DOCUMENTS

| | | | |
|---|---|---|---|
| 6,125,076 A | 9/2000 | Ishikawa | |
| 6,145,063 A | 11/2000 | Ueno et al. | |
| 6,349,054 B1 | 2/2002 | Hidaka | |
| 6,400,637 B1 * | 6/2002 | Akamatsu et al. | 365/230.06 |
| 6,501,679 B2 | 12/2002 | Hidaka | |
| 6,754,099 B2 | 6/2004 | Hidaka | |
| 6,856,539 B2 | 2/2005 | Hidaka | |
| 6,894,922 B1 | 5/2005 | Hidaka | |
| 7,126,845 B2 | 10/2006 | Hidaka | |
| 7,286,431 B2 | 10/2007 | Hidaka | |
| 7,948,795 B2 | 5/2011 | Hidaka | |
| 2002/0080646 A1 | 6/2002 | Hidaka | |

(Continued)

FOREIGN PATENT DOCUMENTS

| | | |
|---|---|---|
| JP | H11-039857 | 2/1999 |
| JP | H11-317074 | 11/1999 |

(Continued)

OTHER PUBLICATIONS

JEDEC Low Power Double Data Rate 2 (LPDDR2) JESD209-2A (Revision of JESD209-2, Mar. 2009) JEDEC Solid State Technology Association.

(Continued)

*Primary Examiner* — Hoai V Ho
*Assistant Examiner* — Min Huang
(74) *Attorney, Agent, or Firm* — Knobbe, Martens, Olson & Bear LLP

(57) ABSTRACT

A semiconductor storage device according to the present embodiment includes local word lines and bit lines intersecting the local word lines. Each memory segment includes nonvolatile memory cells. Each memory segment corresponds to a plurality of the local word lines. A sense amplifier corresponds to a plurality of the bit lines. A global word line corresponds to a plurality of the local word lines, and is commonly driven in the memory segments. A decoder is connected between the global word line and the local word lines corresponding to the global word line, and selectively drives a certain local word line from the local word lines. A segment controller is provided in each memory segment, and selects one of the memory segments to be driven. An input/output part outputs read data from the memory segments or receives write data to the memory segments.

18 Claims, 8 Drawing Sheets

(56) References Cited

U.S. PATENT DOCUMENTS

| | | | |
|---|---|---|---|
| 2003/0076708 A1 | 4/2003 | Hidaka | |
| 2003/0156448 A1 | 8/2003 | Hidaka | |
| 2004/0047172 A1* | 3/2004 | Komatsuzaki | 365/145 |
| 2004/0125650 A1 | 7/2004 | Tsuji | |
| 2004/0223355 A1 | 11/2004 | Hidaka | |
| 2005/0128860 A1 | 6/2005 | Hidaka | |
| 2005/0169067 A1 | 8/2005 | Hidaka | |
| 2006/0104104 A1* | 5/2006 | Park et al. | 365/100 |
| 2007/0014172 A1 | 1/2007 | Hidaka | |
| 2007/0109886 A1* | 5/2007 | Terzioglu et al. | 365/200 |
| 2008/0117670 A1 | 5/2008 | Hidaka | |
| 2008/0247259 A1* | 10/2008 | Kao | 365/230.03 |
| 2008/0298146 A1* | 12/2008 | Terzioglu | 365/200 |
| 2009/0103354 A1 | 4/2009 | Yoon et al. | |
| 2010/0214834 A1 | 8/2010 | Hidaka | |
| 2011/0149629 A1* | 6/2011 | Shim et al. | 365/63 |
| 2012/0243304 A1 | 9/2012 | Hoya | |
| 2014/0085972 A1 | 3/2014 | Ueda | |

FOREIGN PATENT DOCUMENTS

| | | |
|---|---|---|
| JP | 2002-170377 | 6/2002 |
| JP | 2002-197852 | 7/2002 |
| JP | 2004-158162 | 6/2004 |
| JP | 2004-206788 | 7/2004 |
| JP | 2009-064498 | 3/2009 |
| JP | 2011-501342 | 1/2011 |
| JP | 2012-198972 | 10/2012 |
| JP | 2012-203938 | 10/2012 |
| JP | 2012-248248 | 12/2012 |
| WO | WO 99/54881 | 10/1999 |

OTHER PUBLICATIONS

Japanese Office Action dated May 9, 2014 for JP Application No. 2012-060707.

* cited by examiner

SEMICONDUCTOR STORAGE DEVICE AND DRIVING METHOD THEREOF

CROSS REFERENCE TO RELATED APPLICATIONS

This application is based upon and claims the benefit of priority from the prior Japanese Patent Application No. 2012-60707, filed on Mar. 16, 2012, the entire contents of which are incorporated herein by reference.

FIELD

The embodiments of the present invention relate to a semiconductor device and driving method thereof.

BACKGROUND

Generally, nonvolatile memories such as a DRAM (Dynamic Random Access Memory) can comply with JEDEC LPDDR2 (Low Power Double Data Rate 2). In recent years, the development of nonvolatile working memories to which the LPDDR2 is applied has been underway. For example, there has been proposed that a nonvolatile memory having a high access rate such as an MRAM is used as a working memory. A cell current used at a time of reading data in the MRAM is lower than an inversion threshold current used at a time of writing data, and it is a very low current. Therefore, it is necessary for each sense amplifier to have a relatively large area so as to detect a minute current. For this reason, the sense amplifier is shared among a plurality of bit lines and only the selected bit line from the bit lines can be connected to the sense amplifier. Therefore, while the MRAM is higher in an access rate than the DRAM, it is smaller in a data volume (a burst length or a page space) by which data can be read or written at a time than the DRAM.

Meanwhile, it has been proposed for the MRAM that a plurality of global word lines are made to be active so as to increase the burst length in the MRAM. However, as a plurality of global word lines are activated, it increases power consumption.

DETAILED DESCRIPTION

A semiconductor storage device according to the present embodiment includes a plurality of local word lines and a plurality of bit lines intersecting the local word lines. A plurality of memory segments each including a plurality of nonvolatile memory cells are provided to correspond to intersections between the local word lines and the bit lines. Each of the memory segments is provided to correspond to a plurality of the local word lines. A sense amplifier is provided to correspond to a plurality of the bit lines. A global word line is provided to correspond to a plurality of the local word lines, and is configured to be commonly driven in the memory segments. A decoder is connected between the global word line and the local word lines corresponding to the global word line, and is configured to selectively drive a local word line from the local word lines. A segment controller is provided in each of the memory segments, and is configured to select one of the memory segments to be driven. An input/output unit is configured to output read data from each of the memory segments or to receive write data to each of the memory segments.

Embodiments will now be explained with reference to the accompanying drawings. The present invention is not limited to the embodiments.

(First Embodiment)

Figure 1:
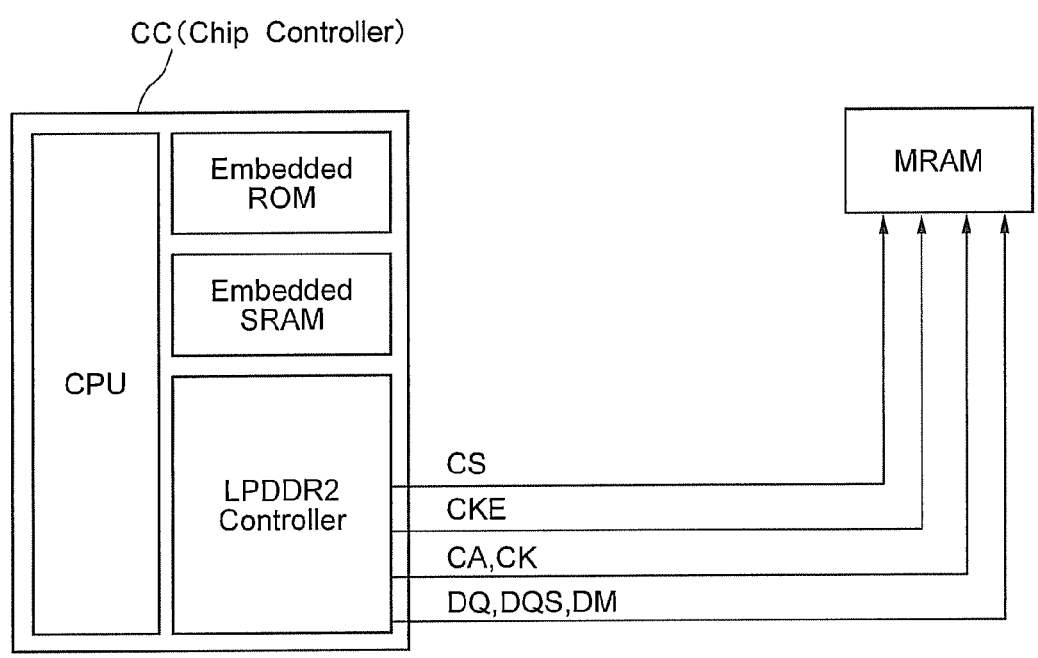
FIG. 1 is a block diagram showing an MRAM and a chip controller CC according to a first embodiment.

FIG. 1 is a block diagram showing an MRAM and a chip controller CC according to a first embodiment. The chip controller CC includes a CPU, a ROM, an SRAM, and an LPDDR2 controller. The LPDDR2 controller outputs a chip selection signal CS, a clock enable signal CKE, a command and address signal CA, a clock signal CK, data DQ, a strobe signal DQS, mask data DM, and the like to the MRAM. The LPDDR2 controller controls the MRAM by using these signals.

While the JEDEC LPDDR2 standard is generally applied to a volatile memory such as a DRAM, the LPDDR2 is applied to the MRAM that is a nonvolatile memory according to the first embodiment.

Figure 2:
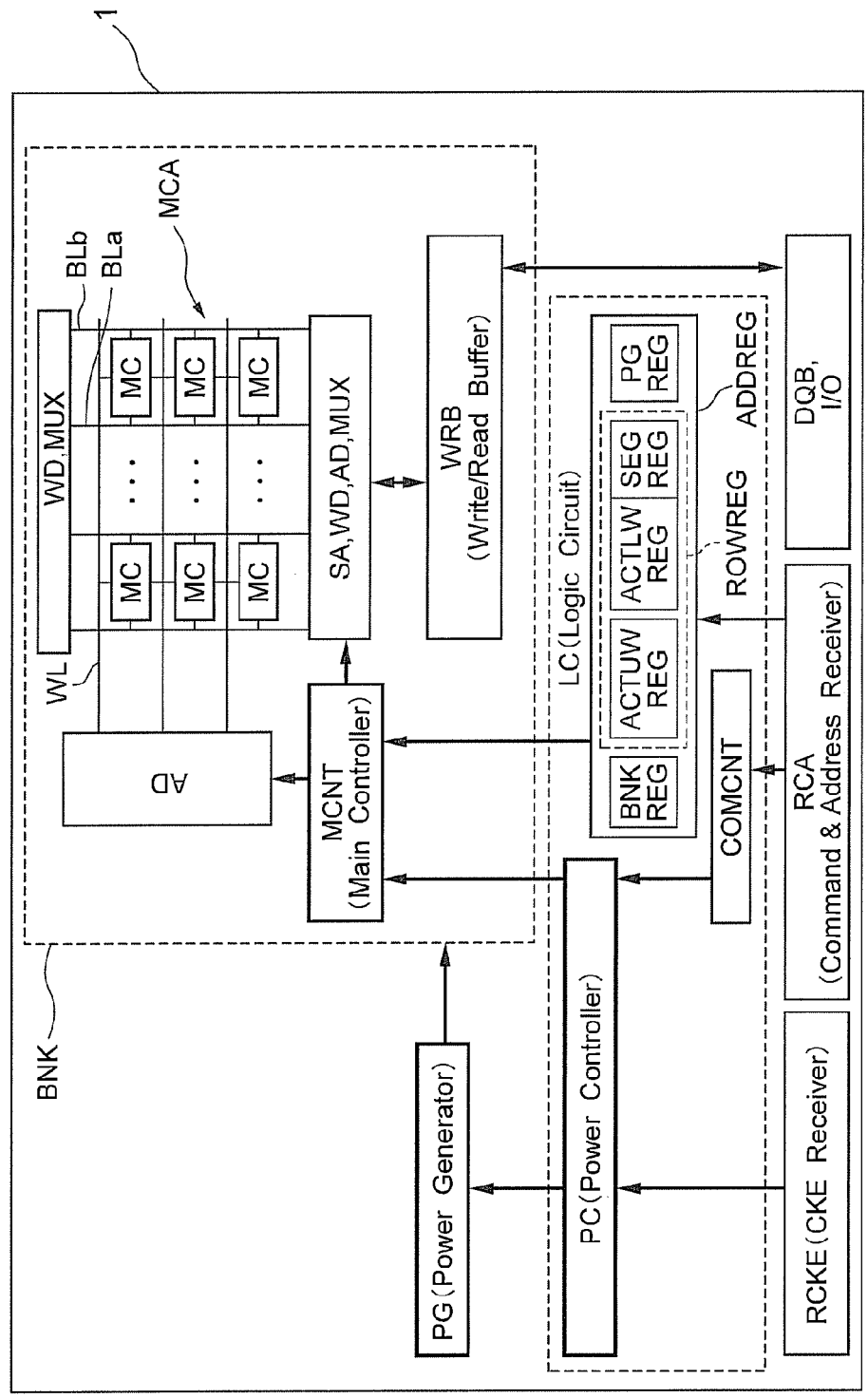
FIG. 2 is a block diagram showing a configuration of the MRAM according to the first embodiment.

FIG. 2 is a block diagram showing a configuration of the MRAM according to the first embodiment. An MRAM chip 1 according to the first embodiment includes a memory cell array MCA, a power generator PG, a logic circuit LC, a clock enable receiver RCKE, a command and address receiver RCA, a data buffer DQB, and an input/output circuit I/O.

The memory cell array MCA includes a plurality of memory cells MC arranged two-dimensionally in a matrix, for example. Each of the memory cells MC is a nonvolatile memory cell and includes an MTJ (Magnetic Tunnel Junction) element, for example. Each memory cell MC is connected to a pair of bit lines (bit lines BLa and BLb shown in FIG. 2, for example) and to one word line WL. That is, one end of the memory cell MC is connected to the bit line BLa that is one of the paired bit lines and the other end thereof is connected to the other bit line BLb. The paired bit lines BLa and BLb are orthogonal to the word lines WL.

The memory cell array MCA also includes sense amplifiers SA, write drivers WD, multiplexers MUX, address decoders AD, a main controller MCNT, and a write/read buffer WRB.

The sense amplifiers SA are connected to the memory cells MC via, for example, the bit lines BLb, respectively, and function to detect data stored in the memory cells MC. The write drivers WD are connected to the memory cells MC via, for example, the bit lines BLa and BLb, and function to write data to the memory cells MC. The multiplexers MUX selectively connect a certain bit line BL among a plurality of bit lines BL to the corresponding sense amplifier SA or the write drivers WDs.

The main controller MCNT transfers data received from the data buffer DQB to the write drivers WD so as to write the data to the memory cells MC, or transfers the data read from the memory cells MC to the data buffer DQB.

The address decoders AD is configured to select a certain bit line BL (or a certain paired bit lines BL) and a certain word line WL based on addresses from the command and address receiver RCA.

The write/read buffer WRB temporarily stores therein write data input via the input/output circuit I/O and the data buffer DQB, or temporarily stores therein read data from the memory cells MC.

The data buffer DQB temporarily stores therein the read data or the write data so as to output the read data to outside of the MRAM chip 1 via the input/output circuit I/O or to transfer the write data fetched in from outside thereof via the input/output circuit I/O.

The clock enable receiver RCKE receives the clock enable signal CKE that determines whether to receive the clock signal CK, and effectively passes through the clock signal CK when the clock enable signal CKE is activated.

The power generator PG generates a power supply voltage for driving the memory cell array MCA. For example, the power generator PG generates a power supply voltage VDD or a reference voltage VSS by boosting or reducing a power supply voltage supplied from outside.

The logic circuit LC includes a power controller PC, a command controller COMCNT, an address register ADDREG, and the like. The power controller PC controls the power generator PG, the main controller MCNT, and the command and address receiver RCA. The power controller PC can selectively make the power generator PG, the main controller MCNT, and the command and address receiver RCA active (turned on) or dormant (turned off).

The command controller COMCNT receives commands that indicate various operations such as a data read operation and a data write operation from the command and address receiver RCA, and controls the main controller MCNT according to those commands.

The command and address receiver RCA receives commands and addresses that determine operations to be performed by the memory cell array MCA. For example, the command and address receiver RCA receives a bank address, a row address, and a page address as the addresses.

The address register ADDREG receives the addresses related to the read operation, the write operation, or the like from the command and address receiver RCA, and reads data on a selected page or writes data to the selected page based on those addresses.

The address register ADDREG includes a bank address register BNKREG, a row address register ROWREG, and a page address register PGREG. The bank address register BNKREG is a register that temporarily holds the bank address for designating a data-read or data-write target memory bank BNK. The row address register ROWREG is a register that temporarily holds the row address for a data-read or data-write target word line WL. The page address register PGREG is a register that temporarily holds the page address for designating a data-read or data-write target page.

The row address register ROWREG includes a global address register ACTUWREG, a local address register ACTLWREG, and a segment address register SEGREG. The global address register ACTUWREG is a register that temporarily holds a global address for designating a data-read or data-write target global word line GWL. The local address register ACTLWREG is a register that temporarily holds a local address for designating a data-read or data-write target local word line LWL. The segment address register SEGREG is a register that temporarily holds a segment address for designating a data-read or data-write target memory segment SEG.

the command and address register RCA receives, for example, an active command ACR, a power down command PD, a deep power down command DPD, an MR write command MRW, an MR read command MRR, and a reset command RST as the commands. The memory cell array MCA can perform various operations in response to these commands, respectively.

Figure 3:
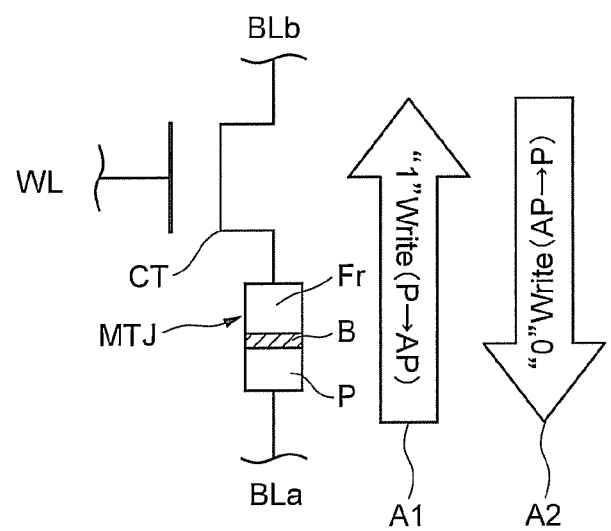
FIG. 3 is an explanatory diagram showing a configuration of the single memory cell MC.

FIG. 3 is an explanatory diagram showing a configuration of the single memory cell MC. Each memory cell MC includes the MTJ element and a cell transistor CT. The MTJ element is an STT (Spin Transfer Torque)-MTJ element. The MTJ element and the cell transistor CT are connected in series between the bit lines BLa and BLb. In the memory cell MC, the cell transistor CT is arranged near the bit line BLb, and the MTJ element is arranged near the bit line BLa. A gate of the cell transistor CT is connected to one word line WL.

The STT-MTJ element that uses the TMR (tunneling magnetoresistive) effect has a stacking structure including two ferromagnetic layers and a nonmagnetic layer (an insulating thin film) sandwiched between the two ferromagnetic layers. The STT-MTJ element stores digital data according to a change in a magnetic resistance due to the spin-polarized tunneling effect. The MTJ element can be made into a low resistance state and a high resistance state depending on magnetization arrangements of the two ferromagnetic layers. For example, if it is defined that the low resistance state is data "0" and that the high resistance state is data "1", one-bit data can be recorded in the MTJ element. Needless to mention, it can be defined that the low resistance state is the data "1" and that the high resistance state is the data "0". For example, as shown in FIG. 3, the MTJ element is formed by sequentially stacking a pinned layer P, a tunnel barrier layer B, and a recording layer Fr. The pinned layer P and the recording layer Fr are made of a ferromagnetic material and the tunnel barrier layer B is made of an insulating film. The pinned layer P is a layer having a fixed magnetization direction, the recording layer Fr is a variable magnetization direction, and the MTJ element stores data depending on the magnetization directions of the pinned layer P and the recording layer Fr.

When a current equal to or higher than an inversion threshold current flows in an arrow A1 direction during the write operation, then the magnetization direction of the recording layer Fr becomes anti-parallel to that of the pinned layer P, and the MTJ element is made into the high resistance state (data "1"). When the current equal to or higher than the inversion threshold current flows in an arrow A2 direction during the data write operation, the magnetization direction of the recording layer Fr becomes parallel to that of the pinned layer P, and the MTJ element is made into the low resistance state (data "0"). In this way, different data can be written to the MTJ element depending on a current direction.

Figure 4:
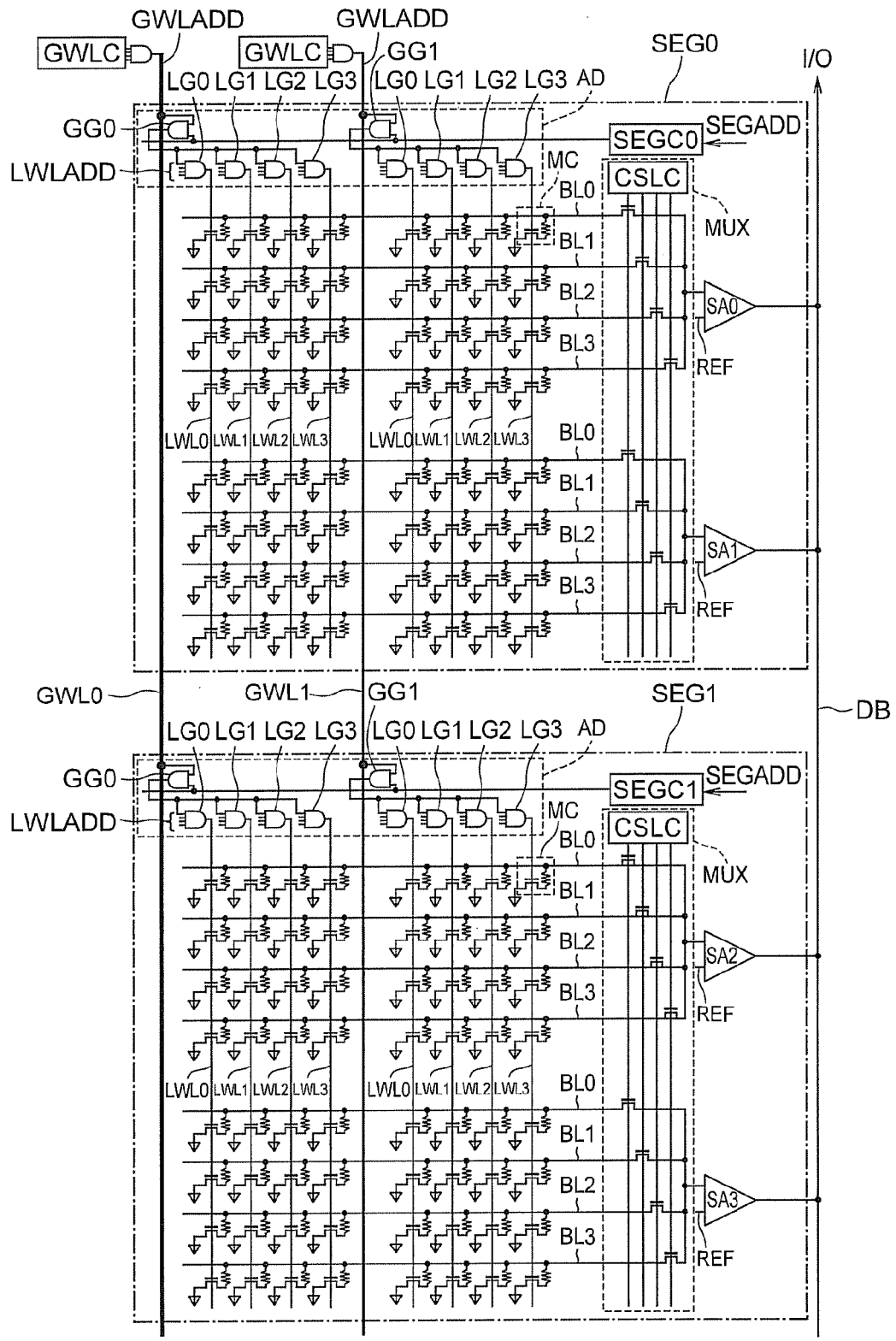
FIG. 4 shows a configuration of the MRAM according to the first embodiment.

FIG. 4 shows a configuration of the MRAM according to the first embodiment. The MRAM according to the first embodiment includes a plurality of memory segments SEG0 and SEG1. The memory segments SEG0 and SEG1 are segments into which each memory bank BNK is further divided, and each of which is constituted by a plurality of memory cells MC. The number of memory segments in each memory bank BNK is not limited to a specific number. FIG. 4 shows an equivalent circuit to the MRAM during the data read operation. For example, the bit line BLb shown in FIG. 3 is selectively connected to the corresponding sense amplifier SA, and the bit line BLa is fixed to a reference voltage (ground voltage, for example). Therefore, in FIG. 4, the bit line BLa is not shown and FIG. 4 expresses the bit line BLb as one of bit lines BL0 to BL3.

In the first embodiment, the memory segments SEG0 and SEG1 share global word lines GWL0 and GWL1 therebetween. On the other hand, each of the memory segments SEG0 and SEG1 is provided to correspond to a plurality of local word lines LWL. That is, each of the memory segments SEG0 and SEG1 include a plurality of local word lines LWL independently. The local word lines LWL included in the memory segment SEG0 are not electrically connected to those included in the memory segment SEG1, but independent of those included in the memory segment SEG1. Segment controllers SEGC0 and SEGC1 are provided to correspond to the memory segments SEG0 and SEG1, respectively. The segment controllers SEGC0 and SEGC1 selectively drive the memory segments SEG0 and SEG1 based on segment addresses SEGADD from the segment address register SEGREG, respectively.

The configuration of the memory segment SEG0 is described in more detail. Because the memory segment SEG1 has a configuration identical to that of the memory segment SEG0, explanations thereof will be omitted.

Each of the global word lines GWL0 and GWL1 are provided to correspond to the four local word lines LWL in each of the memory segments SEG0 and SEG1. For example, when the global word line GWL0 is selected, one of four local word lines LWL0 to LWL3 that correspond to the global word line GWL0 can be selected in the memory segment SEG0.

The bit lines BL are provided to intersect the local word lines LWL. The memory cells MC are provided to correspond to intersections between the local word lines LWL and the bit lines BL, respectively.

Each of the sense amplifiers SA is provided to correspond to the four bit lines BL. One multiplexer MUX is provided between one sense amplifier SA and the bit lines BL. The multiplexer MUX selectively connects one of the four bit lines BL to the corresponding sense amplifier SA. A CSL controller CSLC receives an address from the logic circuit LC shown in FIG. 1, and determines the bit line BL connected to the sense amplifier SA based on the address.

A global word-line controller GWLC selectively drives the global word lines GWL0 and GWL1. The global word lines GWL0 and GWL1 present in the same memory segment SEG0 or SEG1 are not activated simultaneously but one of the global word lines GWL0 and GWL1 is selectively activated according to a global address GWLADD from the global address register ACTUWREG shown in FIG. 2.

The memory segments SEG0 and SEG1 include the segment controllers SEGC0 and SEGC1, respectively. The segment controllers SEGC0 and SEGC1 determine the local word lines LWL is to be driven in which of the memory segments SEG0 and SEG1.

In the memory segment SEG0 or SEG1 that is selected by the segment controllers SEGC0 and SEGC1, the address decoder AD selects one of the local word lines LWL0 to LWL3 based on a local word line address LWLADD from the local address register ACTLWREG shown in FIG. 2.

For example, the segment controller SEGC0 selects the memory segment SEG0. Furthermore, when the global address GWLADD transmitted on the global word line GWL0 is activated to logical high, the address decoder AD can selectively drive one of the local word lines LWL0 to LWL3 corresponding to the global word line GWL0 in the memory segment SEG0.

The segment controller SEGC1 selects the memory segment SEG1. Furthermore, when the global address GWLADD transmitted on the global word line GWL1 is activated to logical high, the address decoder AD can selectively drive one of the local word lines LWL0 to LWL3 in the memory segment SEG1. In this way, each of the segment controllers SEGC0 and SEGC1 can select the memory segment SEG0 or SEG1.

In this way, the address decoder AD drives one of the local word lines LWL0 to LWL3 selected from the local word lines LWL0 to LWL3 based on the segment address SEGADD, the global address GWLADD, and the local word line address LWLADD. The address decoder AD includes global logic gate GG0 and GG1 and local logic gates LG0 to LG3 so as to be able to function as described above.

Each of the global logic gates GG0 and GG1 receives the output (the segment address SEGADD) from the segment controller SEGC0 (or SEGC1) and the output (the global address GWLADD) from the global word line controller GWLC. Each of the global logic gates GG0 and GG1 outputs an activation signal when both the segment controller SEGC0 and the global word line controller GWLC are activated. For example, when the global word line GWL0 and the segment controller SEGC0 are activated, the global logic gate GG0 in the memory segment SEG0 outputs logical high as the activation signal. The activation signal output from the global logic gate GG0 is thereby input to the local word lines LWL0 to LWL3 corresponding to the global word line GWL0 in the memory segment SEG0.

The local logic gates LG0 to LG3 receive the output from the global logic gate GG0 and the local word line address LWLADD. The local logic gates LG0 to LG3 selectively drive one local word line LWLi (where i=0 to 3) from the local word lines LWL0 to LWL3 based on the local word line address LWLADD when the output from the global logic gate GG0 is activated. The local word line LWLi selected in one of the memory segments SEG0 and SEG1 that share the global word lines GWL0 and GWL1 therebetween is thereby driven.

In this way, the local word line LWLi can be selected by the global word line controller GWLC, the segment controllers SEGC0 and SEGC1, and the local word line address LWLADD. The address decoder AD can thereby selectively drive the selected local word line LWLi.

Each of the sense amplifiers SA0 to SA3 detects data stored in the selected memory cell MC connected to the bit line BL that is selected by the multiplexer MUX and to the selected local word line LWLi. The multiplexer MUX selects the bit line BL based on a bit line address. The bit line address is input from outside of the MRAM chip 1 so as to select the bit line BL. The sense amplifiers SA0 and SA1 in the memory segment SEG0 can thereby detect and latch the data simultaneously. Therefore, in the first embodiment, the data stored in a plurality of memory cells MC is simultaneously detected in the memory segment SEG0.

In the memory segments SEG0 and SEG1 that share the global word lines GWL0 and GWL1 therebetween, the sense amplifiers SA0 to SA3 can detect data simultaneously. That is, the sense amplifiers SA0 to SA3 can detect and latch four-bit data. Needless to mention, when the number of segments that share the global word lines GWL0 and GWL1 is large, the volume of simultaneously detected data (a page space) becomes large proportionally.

Meanwhile, the memory segments SEG0 and SEG1 that share the global word lines GWL0 and GWL1 therebetween can operate independently of each other. That is, the sense amplifiers SA in the memory segment SEG0 and those in the memory segment SEG1 can detect data at a different timing. Such an operation is possible because the memory segments SEG0 and SEG1 individually include the segment controllers SEGC0 and SEGC1, respectively.

The memory segments SEG0 and SEG1 that share the global word lines GWL0 and GWL1 also share a data bus DB therebetween. Therefore, the sense amplifiers SA0 to SA3 output data to the input/output circuit I/O via the common data bus DB, or receive data from the input/output circuit I/O via the common data bus DB.

Figure 5:
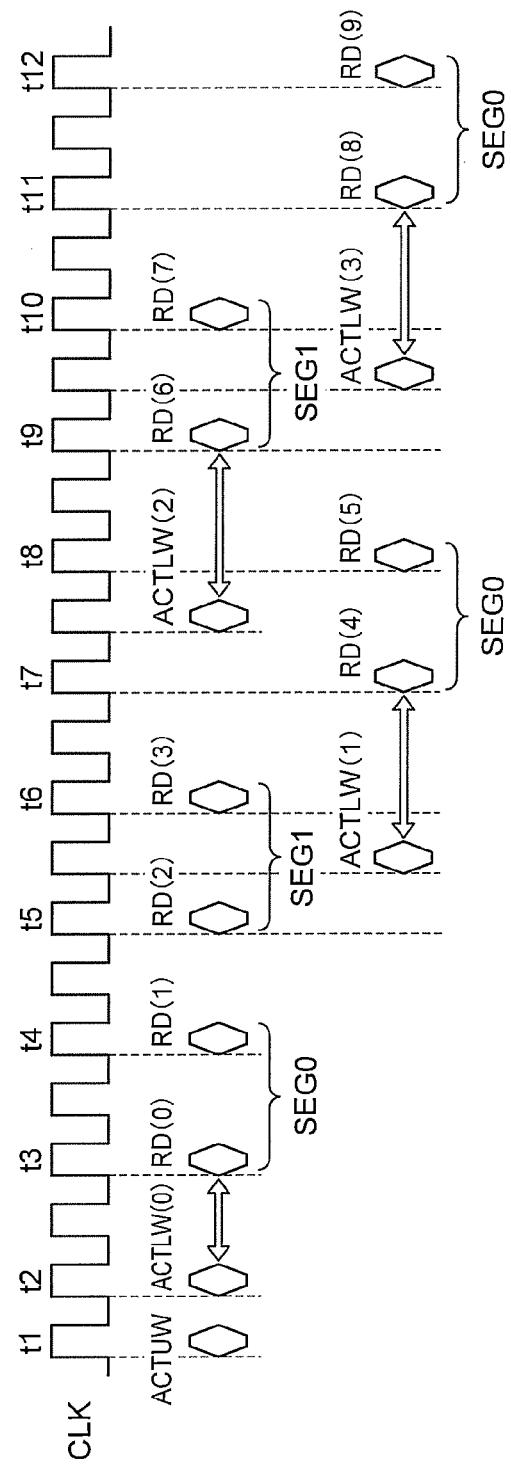
FIG. 5 is a timing diagram showing the data read operation performed by the MRAM according to the first embodiment.

FIG. 5 is a timing diagram showing the data read operation performed by the MRAM according to the first embodiment. In the first embodiment, when the memory segment SEG0 outputs the read data from the input/output circuit I/O or the write data is input to the memory segment SEG0 from the input/output circuit I/O, the memory segment SEG1 changes the local word line LWL to be driven. On the other hand, when the memory segment SEG1 outputs the read data from the input/output circuit I/O or the write data is input to the memory segment SEG1 from the input/output circuit I/O, the memory segment SEG0 changes the local word line LWL to be driven. In this way, in the first embodiment, the memory segments SEG0 and SEG1 can alternately output the data. That is, in the first embodiment, the memory segments SEG0 and SEG1 can be pipeline-controlled.

The operation performed by the MRAM according to the first embodiment is described in more detail. Note that the MRAM operates based on a clock signal CLK. Furthermore, in a series of read operations (or write operations) since the global word line GWL0 is selected until a precharge command is issued, each of the multiplexers MUX fixes the bit lines BL to be connected to the sense amplifiers SA0 to SA3, respectively among the bit lines BL0 to BL3.

First, from t1 to t2, an upper active command ACTUW and a lower active command ACTLW are issued. The upper active command ACTUW includes the global address GWLADD. Therefore, one of the global word lines GWL0 and GWL1 is selected based on the upper active command ACTUW. The lower active command ACTLW includes the segment address SEGADD and the local word line address LWLADD. Therefore, one of the memory segments SEG0 and SEG1 is selected and one of the local word lines LWL0 to LWL3 is selected according to the lower active command ACTLW. In addition, the bit lines BL to be connected to the respective sense amplifiers SA are selected. In this way, in the data read operation or the data write operation, the upper active command ACTUW and the lower active command ACTLW can designate one global word line GWL, one memory segment SEG, one local word line LWL, and the bit lines BL.

For example, at t1, it is assumed that the upper active command ACTUW designates the global word line GWL0. The global word line controller GWLC thereby drives the global word line GWL0.

At t2, it is assumed that a lower active command ACTLW (0) designates the local word line WLW0 and the bit line BL0 in each of the memory segments SEG0 and SEG1. The segment controllers SEGC0 and SEGC1 and the address decoders AD thereby drive the local word lines LWL0 in the memory segments SEG0 and SEG1, respectively. Furthermore, the multiplexers MUX connect the four bit lines BL0 to the sense amplifiers SA0 to SA3, respectively.

From t2 to t3, the sense amplifiers SA0 to SA3 detect the data stored in the four memory cells MC each connected to one bit line BL0 and one local word line LWL0. In the first embodiment, a two-clock period is necessary for the sense amplifiers SA0 to SA4 to detect the data stored in these memory cells MC, respectively.

From t3 to t6, read commands RD(0) to RD(3) are issued. The read commands RD(0) to RD(3) are commands that instruct the read data latched by the sense amplifiers SA0 to SA3 to be output to outside of the MRAM chip 1, respectively. The sense amplifiers SA0 to SA3 need to transfer the data to the data buffer DQB and the input/output circuit I/O at a different timing, because the data bus DB is shared among the sense amplifiers SA0 to SA3. In the following explanations, the data buffer DQB and the input/output circuit I/O are simply referred to as "input/output circuit I/O".

For example, the sense amplifier SA0 transfers the data to the input/output circuit I/O in response to the read command RD(0), the sense amplifier SA1 transfers the data to the input/output circuit I/O in response to the read command RD(1), the sense amplifier SA2 transfers the data to the input/output circuit I/O in response to the read command RD(2), and the sense amplifier SA3 transfers the data to the input/output circuit I/O in response to the read command RD(3). This can prevent collision of the read data from the respective sense amplifiers SA0 to SA3 on the data bus DB.

Note that the sense amplifiers SA0 to SA3 do not always need to output the data in this order. Furthermore, all the sense amplifiers SA0 to SA3 do not always need to output the data. That is, it suffices that one or two or more out of the sense amplifiers SA0 to SA3 output the data at a different timing.

In the first embodiment, before t5, the sense amplifiers SA0 and SA1 in the memory segment SEG0 already transfers the read data to the input/output circuit I/O based on the read commands RD(0) and RD(1), respectively. Therefore, after t5, the address decoder AD can change the local word line LWL0 driven in the memory segment SEG0 to one of the other local word lines LWL1 to LWL3.

In the first embodiment, between t5 and t6, a lower active command ACTLW(1) is issued. The lower active command ACTLW(1) is a command that designates the memory segment SEG0 and the local word line LWL1. In the memory segment SEG0, the segment controller SEGC0 and the address decoder AD thereby change the driven local word line LWL from LWL0 to LWL1 based on the lower active command ACTLW(1).

On the other hand, in the memory segment SEG1, the sense amplifier SA2 transfers the read data to the input/output circuit I/O based on the read command RD(2) at t5, and the sense amplifier SA3 transfers the read data to the input/output circuit I/O based on the read command RD(3) at t6.

In this way, while the read data is output from the input/output circuit I/O in the first memory segment SEG1, the segment controller SEGC0 and the address decoder AD change the driven local word line LWL among the local word lines LWL corresponding to the global word line GWL0 from LWL0 to LWL1 in the second memory segment SEG0.

After the lower active command ACTLW(1) is issued, the two-clock period is necessary for the sense amplifiers SA0 and SA1 to detect the data stored in the memory cells MC connected to the local word line LWL1 and the bit lines BL0 in the memory segment SEG0. In FIG. 5, a read command RD(4) is issued after the passage of a three-clock period since the lower active command ACTLW(1) is issued.

From t7 to t8, read commands RD(4) and RD(5) are issued. The read commands RD(4) and RD(5) are commands that instruct the read data latched by the sense amplifiers SA0 and SA1 to be output to outside of the MRAM chip 1, respectively.

In the first embodiment, before t7, the sense amplifiers SA2 and SA3 in the memory segment SEG1 already transfers the read data to the input/output circuit I/O based on the read commands RD(2) and RD(3), respectively. Therefore, after t7, the address decoder AD can change the local word line LWL0 driven in the memory segment SEG1 to one of the other local word lines LWL1 to LWL3.

In the first embodiment, between t7 and t8, a lower active command ACTLW(2) is issued. The lower active command ACTLW(2) is a command that designates the memory segment SEG1 and the local word line LWL1. In the memory segment SEG1, the segment controller SEGC1 and the address decoder AD thereby change the driven local word line LWL from LWL0 to LWL1 in response to the lower active command ACTLW(2).

On the other hand, in the memory segment SEG0, the sense amplifier SA0 transfers the read data to the input/output circuit I/O based on the read command RD(4) at t7, and the sense amplifier SA1 transfers the read data to the input/output circuit I/O based on the read command RD(5) at t8.

In this way, while the read data is output from the input/output circuit I/O in the second memory segment SEG0, the segment controller SEGC1 and the address decoder AD change the driven local word line from LWL0 to LWL1 in the first memory segment SEG1.

After the lower active command ACTLW(2) is issued, the two-clock period is necessary for the sense amplifiers SA2 and SA3 to detect the data stored in the memory cells MC connected to the local word line LWL1 and the bit lines BL0 in the memory segment SEG1. In FIG. 5, a read command RD(6) is issued after the passage of a three-clock period since the lower active command ACTLW(2) is issued.

From t9 to t10, read commands RD(6) and RD(7) are issued. The read commands RD(6) and RD(7) are commands that instruct the read data latched by the sense amplifiers SA2 and SA3 to be output to outside of the MRAM chip 1, respectively.

In the first embodiment, before t9, the sense amplifiers SA0 and SA1 in the memory segment SEG0 already transfers the read data to the input/output circuit I/O based on the read commands RD(4) and RD(5), respectively. Therefore, after t9, the address decoder AD can change the local word line LWL1 driven in the memory segment SEG0 to one of the other local word lines LWL0, LW2, and LWL3.

In the first embodiment, between t9 and t10, a lower active command ACTLW(3) is issued. The lower active command ACTLW(3) is a command that designates the memory segment SEG0 and the local word line LWL2. In the memory segment SEG0, the segment controller SEGC0 and the address decoder AD thereby change the driven local word line from LWL1 to LWL2 based on the lower active command ACTLW(3).

On the other hand, in the memory segment SEG1, the sense amplifier SA2 transfers the read data to the input/output circuit I/O based on the read command RD(6) at t9, and the sense amplifier SA3 transfers the read data to the input/output circuit I/O based on the read command RD(7) at t10.

In this way, while the read data is output from the input/output circuit I/O in the first memory segment SEG1, the segment controller SEGC0 and the address decoder AD change the driven local word line from LWL1 to LWL2 in the second memory segment SEG0.

After the lower active command ACTLW(3) is issued, the two-clock period is necessary for the sense amplifiers SA0 and SA1 to detect the data stored in the memory cells MC connected to the local word line LWL2 and the bit lines BL0 in the memory segment SEG0. In FIG. 5, a read command RD(8) is issued after the passage of a three-clock period since the lower active command ACTLW(3) is issued.

From t11 to t12, read commands RD(8) and RD(9) are issued. The read commands RD(8) and RD(9) are commands that instruct the read data latched by the sense amplifiers SA0 and SA1 to be output to outside of the MRAM chip 1, respectively.

In this way, in the first embodiment, the segment controllers SEGC0 and SEGC1 can operate independently of each other based on the segment address SEGADD, and control the corresponding memory segments SEG0 and SEG1 to selectively operate, respectively.

The memory segments SEG0 and SEG1 can alternately repeat outputting the data from the input/output circuit I/O and changing the driven local word lines LWL0 to LWL3 among the local word lines LWL corresponding to the global word line GWL0, in the read operation. That is, in the first embodiment, the memory segments SEG0 and SEG1 can be pipeline-controlled. As a result, a burst length or a page space of the read data can be increased in the MRAM according to the first embodiment. Furthermore, it is possible to suppress the power consumption because the driven global word line GWL0 does not change. Furthermore, it is possible to decrease the number of issued commands when the upper and lower active commands ACTUW and ACTLW do not change whenever the row address is changed. The upper and lower active commands ACTUW and ACTLW may or may not change when the row address is changed.

Figure 6:
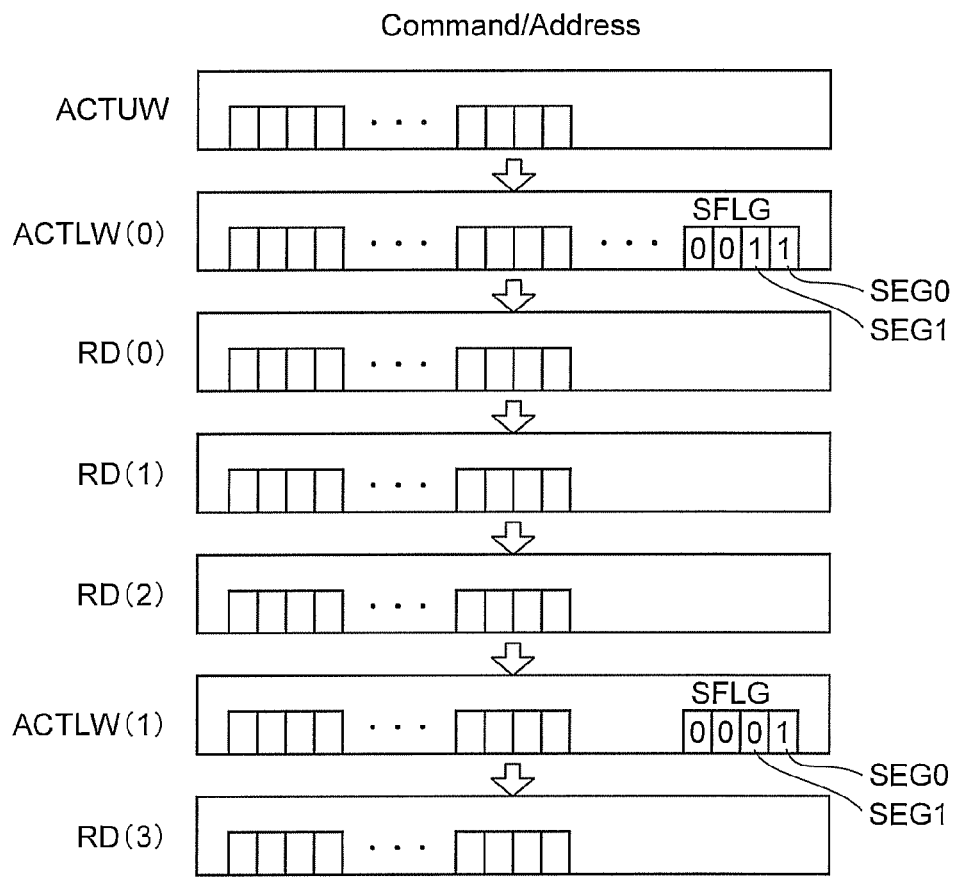
FIG. 6 is a conceptual diagram showing bit information on the upper active command ACTUW, the lower active command ACTLW(0), the read commands RD(0) to RD(3), and the lower active command ACTLW(1)

In FIG. 5, the period between the lower active command ACTLW(0) and the read command RD(0) is two clocks, and the periods between the other lower active commands ACTLW(1) to ACTLW(3) and the read commands RD(4), RD(6), and RD(8) right after the lower active commands ACTLW(1) to ACTLW(3) are three clocks. Because the lower active commands ACTLW and the read commands RD can operate independently of one another, it suffices to keep the periods therebetween to be equal to or longer than a minimum period (two clocks, for example). FIG. 6 is a conceptual diagram showing bit information on the upper active command ACTUW, the lower active command ACTLW(0), the read commands RD(0) to RD(3), and the lower active command ACTLW(1) shown in FIG. 5. FIG. 6 shows respective commands in chronological order of issuance.

Among these signals, each of the lower active commands ACTLW(0) and ACTLW(1) includes a segment flag SFLG. The segment flag SFLG is a flag that indicates whether to be able to change the local word lines LWL0 to LWL3 in every memory segment SEG0 or SEG1.

For example, in the lower active command ACTLW(0), the flags SFLG of the memory segments SEG0 and SEG1 are both on. Therefore, in the memory segments SEG0 and SEG1, the segment controllers SEGC0 and SEGC1 and the address decoders AD can select the local word lines LWL0.

In the lower active command ACTLW(1), the flag SFLG of the memory segment SEG0 is on. Therefore, in the memory segment SEG0, the segment controller SEGC0 and the address decoder AD can change the local word line from LWL0 to LWL1. In the lower active commands ACTLW(1), the flag SFLG of the memory segment SEG1 is not on. Therefore, in the memory segment SEG1, the local word line LWL is not changed.

Although not shown in FIG. 6, the segment flag SFLG of the lower active command ACTLW(2) is "0010". The segment flag SFLG of the lower active command ACTLW(3) is "0001".

Each of the segment flags SFLG shown in FIG. 6 is four-bit data. This is on an assumption that the number of memory segments SEG that share one global word line GWL is four. That is, it is assumed that one memory bank BNK is divided into four segments. In this case, in the read operation, for example, memory segments SEG0 to SEG3 can repeat outputting data from the input/output circuit I/O and changing the driven local word lines LWL either in order or at random.

Figure 7:
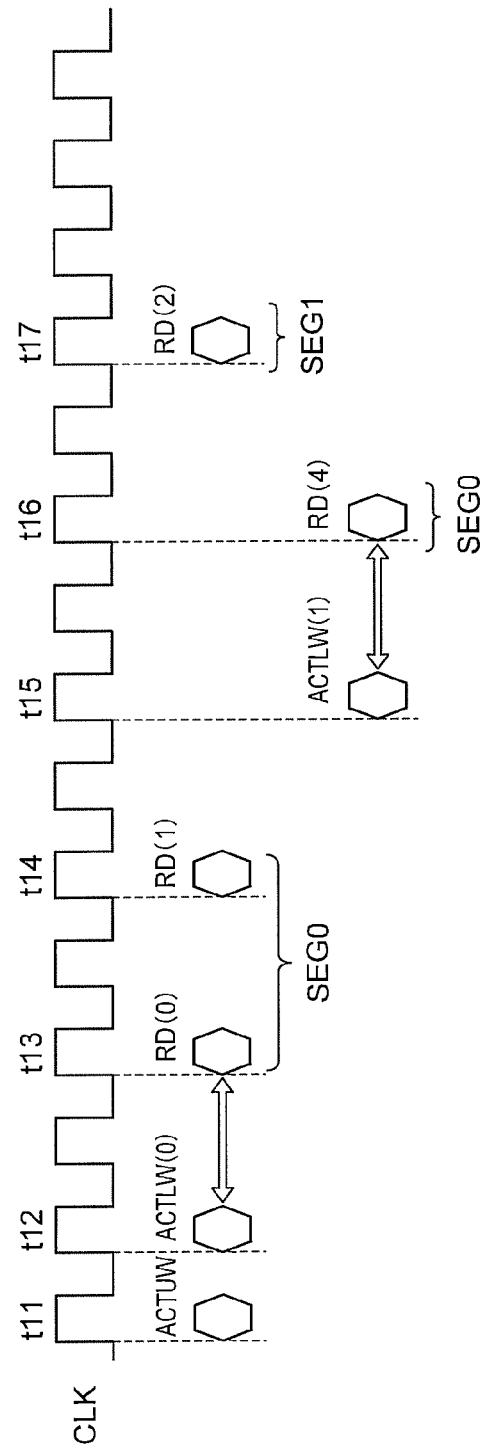
FIG. 7 is a timing diagram showing another example of the data read operation performed by the MRAM according to the first embodiment.

FIG. 7 is a timing diagram showing another example of the data read operation performed by the MRAM according to the first embodiment. While FIG. 5 shows continuous burst read, it is also possible to read the data while changing the local word lines LWL in the same memory segment SEG0 as shown in FIG. 7.

For example, from t11 to t14, it is assumed that the local word line LWL3 is selected in response to the lower active command ACTLW(0) in the memory segment SEG0. In this case, the sense amplifiers SA0 and SA1 detect data stored in the memory cells MC connected to the local word line LWL3. The sense amplifiers SA0 and SA1 outputs the data to outside of the MRAM chip 1 in response to the read commands RD(0) and RD(1), respectively.

Thereafter, from t15 to t16, it is assumed that the local word line LWL2 is selected in response to the lower active command ACTLW(1) in the memory segment SEG0. In this case, the sense amplifiers SA0 and SA1 detect data stored in the memory cells MC connected to the local word line LWL2. The sense amplifier SA0 outputs the data to outside of the MRAM chip 1 in response to the read command RD(4).

From t12 to t13, similarly to the sense amplifiers SA0 and SA1 in the memory segment SEG0, the sense amplifiers SA2 and SA3 can detect data stored in the memory cells MC connected to the local word line LWL3 in the memory segment SEG1. In this case, as shown in t17 of FIG. 7, the sense amplifier SA2 or SA3 outputs the data to outside of the MRAM chip 1 in response to the read command RD(2). In this way, the MRAM according to the first embodiment can read the data while changing the memory segments SEG or the local word lines LWL at random.

In this case, it is unnecessary to discharge and recharge the global word line GLW0 at a time of changing the local word lines LWL. Therefore, the MRAM according to the first embodiment, that physically shares the global word lines GWL and that takes the address space into consideration, can improve power consumption efficiency.

While the data read operation has been described in the first embodiment, the descriptions also apply to the data write operation. That is, in the MRAM according to the first embodiment, during the data write operation, similarly to the data read operation, when write data to be written to the first memory segment SEG1 is input to the input/output circuit I/O, the segment controller SEGC0 and the address decoder AD change the local word line LWL driven in the second memory segment SEG0. On the other hand, when write data to be written to the second memory segment SEG0 is input to the input/output circuit I/O, the segment controller SEGC1 and the address decoder AD change the local word line LWL driven in the first memory segment SEG1.

In the first embodiment, the memory segments SEG0 and SEG1 can thereby alternately repeat receiving the data input to the input/output circuit I/O and changing the driven local word lines LWL0 to LWL3 from the local word lines LWL corresponding to the global word line GWL0. That is, in the first embodiment, the memory segments SEG0 and SEG1 can be pipeline-controlled. As a result, a burst length or a page space of the write data can be increased in the MRAM according to the first embodiment. Furthermore, it is possible to suppress the power consumption because the global word line GWL0 does not change.

Furthermore, because a plurality of ACTLW commands can be issued for one ACTUW command, it is possible to decrease the number of issued commands. That is, the MRAM according to the first embodiment is high in command efficiency.

(Second Embodiment)

In a second embodiment, when the read data from the first memory segment SEG1 is output from the input/output circuit I/O in response to a READ command, or when the write data to the first memory segment SEG1 is input to the input/output circuit I/O in response to a WRITE command, the multiplexer MUX can selectively activate the bit lines BL0 to BL3 to be connected to the sense amplifiers SA0 and SA1 in response to an ACTLW command in the second memory segment SEG0.

On the other hand, when the read data from the second memory segment SEG0 is output from the input/output circuit I/O in response to the READ command, or when the write data to the second memory segment SEG0 is input to the input/output circuit I/O in response to the WRITE command, the multiplexer MUX can selectively activate the bit lines BL0 to BL3 to be connected to the sense amplifiers SA2 and SA3 in response to the ACTLW command in the first memory segment SEG1.

The configuration of an MRAM according to the second embodiment can be the same as that shown in FIG. 4. Operations of the MRAM according to the second embodiment can be basically the same as those shown in FIG. 5 or FIG. 7. However, the MRAM according to the second embodiment changes the bit line addresses in response to the issuance of the lower active commands ACTLW(0) to ACTLW(3).

For example, in FIG. 5, the multiplexers MUX select the bit lines BL to be connected to the sense amplifiers SA0 to SA3 based on the lower active command ACTLW(0) in the memory segments SEG0 and SEG1. For example, in each of the memory segments SEG0 and SEG1, the multiplexer MUX connects the bit line BL0 to each of the sense amplifiers SA0 to SA3.

The multiplexer MUX changes the bit lines BL to be connected to the sense amplifiers SA0 and SA1 from BL0 to BL1 based on the lower active command ACTLW(1) in the memory segment SEG0.

The multiplexer MUX changes the bit lines BL to be connected to the sense amplifiers SA2 and SA3 from BL0 to BL1 based on the lower active command ACTLW(2) in the memory segment SEG1.

The multiplexer MUX changes the bit lines BL to be connected to the sense amplifiers SA0 and SA1 from BL0 to BL1 based on the lower active command ACTLW(3) in the memory segment SEG0.

In a series of read operations (or write operations) since the global word line GWL0 is selected until the precharge command is issued, each of the address decoders AD fixes the driven local word line LW0.

In this way, in the second embodiment, the memory segments SEG0 and SEG1 can alternately repeat outputting the data from the input/output circuit I/O and changing the bit lines BL0 to BL3 connected to the sense amplifiers SA0 to SA3, in the read operation. That is, in the second embodiment, similarly to the first embodiment, the memory segments SEG0 and SEG1 can be pipeline-controlled. As a result, the burst length or the page space of the read data can be increased in the MRAM according to the second embodiment. Furthermore, it is possible to suppress the power consumption because the driven global word line GWL0 and the driven local word line LWL0 do not change.

(Modification)

Figure 8:
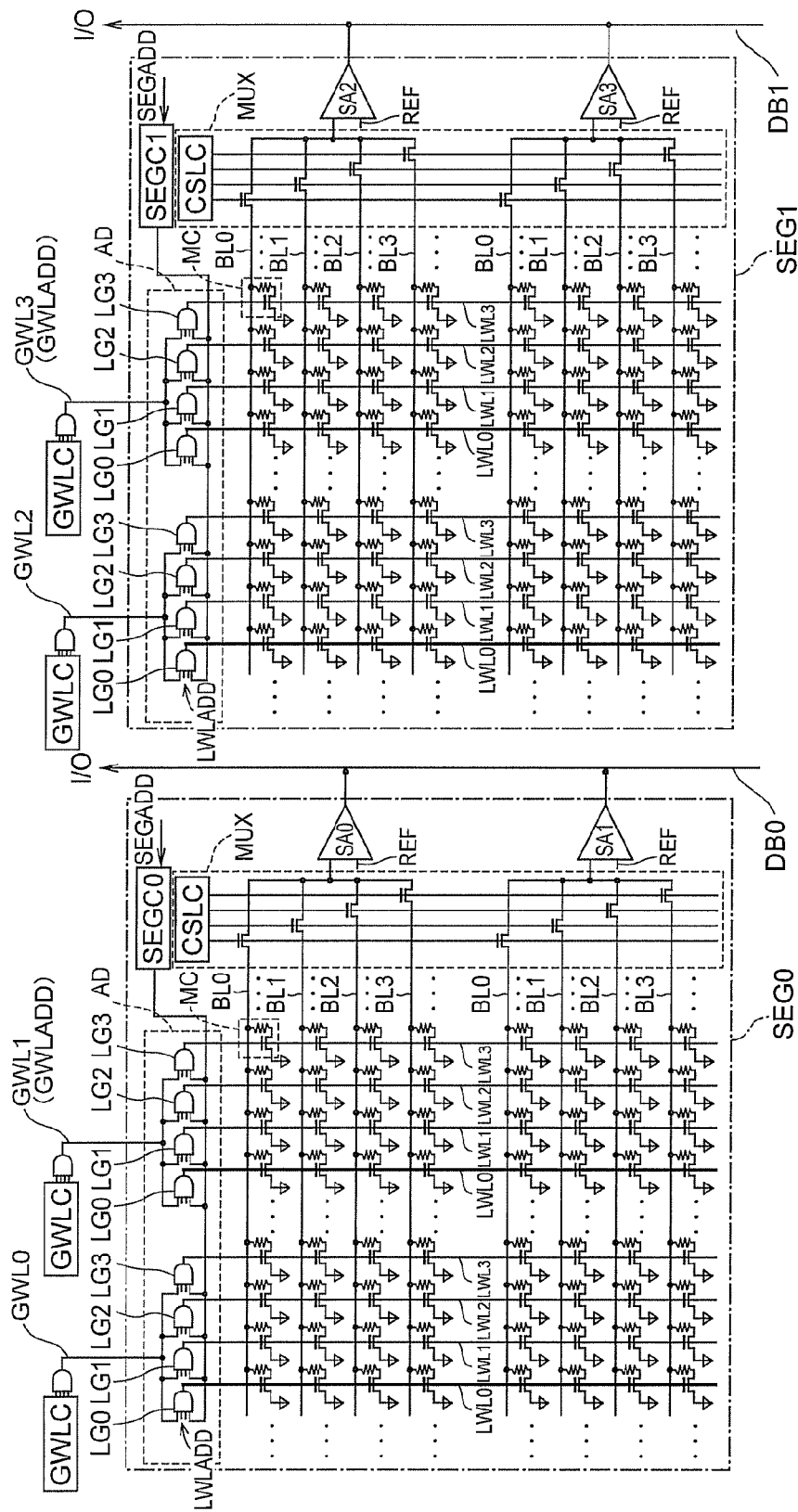
FIG. 8 shows a configuration of an MRAM according to a modification of the second embodiment.

FIG. 8 shows a configuration of an MRAM according to a modification of the second embodiment. FIG. 8 shows an equivalent circuit to the MRAM during the data read operation. For example, the bit line BLb shown in FIG. 3 is selectively connected to the corresponding sense amplifier SA, and the bit line BLa is fixed to a reference voltage (ground, for example). Therefore, in FIG. 8, the bit line BLa is not shown and FIG. 8 expresses the bit line BLb as one of bit lines BL0 to BL3.

In the present modification, the memory segments SEG0 and SEG1 are arrayed in an extending direction of the bit lines BL, and do not share the global word lines GWL0 and GWL1 and the data bus DB therebetween.

Nevertheless, the MRAM according to the present modification operates similarly to that according to the second embodiment. Therefore, the global word line controller GWLC commonly and simultaneously drives the global word lines GWL0 (or GWL2) and GWL2 (or GWL3) in the memory segments SEG0 and SEG1. That is, the memory segments SEG0 and SEG1 logically share the global word lines GWL0 and GWL1 and the data bus DB therebetween. Furthermore, the segment controllers SEGC0 and SEGC1 commonly (simultaneously) drive one local word line LWLi in the memory segments SEG0 and SEG1, respectively.

When the read data from the first memory segment SEG1 is output from the input/output circuit I/O, or when the write data to the first memory segment SEG1 is input to the input/output circuit I/O, the multiplexer MUX changes the bit lines BL0 to BL3 to be connected to the sense amplifiers SA0 and SA1 in the second memory segment SEG0.

On the other hand, when the read data from the second memory segment SEG0 is output from the input/output circuit I/O, or when the read data to the second memory segment SEG0 is input to the input/output circuit I/O, the multiplexer MUX changes the bit lines BL0 to BL3 to be connected to the sense amplifiers SA2 and SA3 in the first memory segment SEG1.

With this configuration, although the memory segments SEG0 and SEG1 do not share the global word lines GWL0 and GWL1 and the data bus DB therebetween, the present modification can achieve effects identical to those of the second embodiment.

The present modification is also applicable to the first embodiment. That is, the memory segments SEG0 and SEG1 can be pipeline-controlled by alternately repeating input/output of the data and changes in the driven local word lines LWL0 to LWL3 among the local word lines LWL corresponding to the global word line GWL0.

(Third Embodiment)

A third embodiment is a combination of the first and second embodiments. That is, an MRAM according to the third embodiment changes the local word lines LWL to be driven and/or changes the bit lines BL to be connected to the sense amplifiers SA0 to SA3 when the lower active commands ACTLW(0) to ACTLW(3) are issued.

Therefore, when the read data from the first memory segment SEG1 is output from the input/output circuit I/O, or when the write data to the first memory segment SEG1 is input to the input/output circuit I/O, the segment controller SEGC0 and the address decoder AD can change the driven local word line LWL0 among the local word lines LWL corresponding to the global word line GWL0 in the second memory segment SEG0. That is, the memory segments SEG0 and SEG1 can be pipeline-controlled.

On the other hand, when the read data from the second memory segment SEG0 is output from the input/output circuit I/O, or when the write data to the second memory segment SEG0 is input to the input/output circuit I/O, the segment controller SEGC1 and the address decoder AD can change the driven local word line LWL0 in the first memory segment SEG1. That is, the memory segments SEG0 and SEG1 can be pipeline-controlled.

When the read data from the first memory segment SEG1 is output from the input/output circuit I/O, or when the write data to the first memory segment SEG1 is input to the input/output circuit I/O, the multiplexer MUX can pipeline-control the bit lines BL0 to BL3 connected to the sense amplifiers SA0 and SA1 in the second memory segment SEG0.

On the other hand, when the read data from the second memory segment SEG0 is output from the input/output circuit I/O, or when the write data to the second memory segment SEG0 is input to the input/output circuit I/O, the multiplexer MUX can pipeline-control the bit lines BL0 to BL3 connected to the sense amplifiers SA2 and SA3 in the first memory segment SEG1.

The configuration of the MRAM according to the third embodiment can be the same as that shown in FIG. 4. Operations of the MRAM according to the third embodiment can be basically the same as those shown in FIG. 5 or FIG. 7. However, the MRAM according to the third embodiment changes the local word lines LWL and/or the bit line addresses in response to the lower active commands ACTLW(0) to ACTLW(3). In a series of read operations (or write operations) since the global word line GWL0 is selected until the precharge command is issued, it is possible to access any memory cells MC in the memory segments SEG0 and SEG1. In addition, the third embodiment has the effects of the first and second embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of local word lines;
a plurality of bit lines intersecting the local word lines;
a plurality of memory segments each including a plurality of nonvolatile memory cells provided to correspond to intersections between the local word lines and the bit lines, each of the memory segments being provided to correspond to a plurality of the local word lines;
a sense amplifier provided to correspond to a plurality of the bit lines;
a global word line provided to correspond to a plurality of the local word lines, and configured to be commonly driven in the memory segments;
a decoder connected between the global word line and the local word lines corresponding to the global word line, and configured to selectively drive a certain local word line from the local word lines;
a segment controller provided in each of the memory segments, and configured to select one of the memory segments to be driven; and
an input/output part configured to output read data from the memory segments or to receive write data to the memory segments, wherein
during a read operation in which the sense amplifier reads out a certain page data, the segment controller and the decoder change the local word line selected in a second memory segment among the memory segments without changing the global word line selected in the second memory segment, when read data from a first memory segment among the memory segments is output from the input/output part.

2. The device of claim 1, further comprising an address register configured to receive a global address designating the global word line, a local address designating one of the local word lines, and a segment address designating one of the memory segments from the input/output part and to temporarily hold the global address, the local address, and the segment address, wherein
 a certain memory segment is selected from the memory segments based on the segment address, and the segment controller corresponding to the selected memory segment operates independently, and
 in the selected memory segment, the decoder selectively drives a certain local word line from the local word lines based on the global address and the local address.

3. The device of claim 1, wherein during a write operation of a certain page data, the segment controller and the decoder change the local word line selected in a second memory segment among the memory segments without changing the global word line selected in the second memory segment, when write data to the first memory segment is input to the input/output part.

4. The device of claim 2, wherein during a write operation of a certain page data, the segment controller and the decoder change the local word line selected in a second memory segment among the memory segments without changing the global word line selected in the second memory segment, when write data to the first memory segment is input to the input/output part.

5. The device of claim 3, wherein the segment controller and the decoder change the local word line selected in the first memory segment when read data from the second memory segment is output from the input/output part or when write data to the second memory segment is input to the input/output part.

6. The device of claim 4, wherein the segment controller and the decoder change the local word line selected in the first memory segment when read data from the second memory segment is output from the input/output part or when write data to the second memory segment is input to the input/output part.

7. The device of claim 2, further comprising a multiplexer provided between the bit lines and the sense amplifier, the multiplexer being configured to connect a bit line selected from the bit lines to the sense amplifier, wherein
 during a data read operation or a data write operation, the multiplexer fixes a bit line to be connected to the sense amplifier among the bit lines.

8. The device of claim 3, further comprising a multiplexer provided between the bit lines and the sense amplifier, the multiplexer being configured to connect a bit line selected from the bit lines to the sense amplifier, wherein
 during a data read operation or a data write operation, the multiplexer fixes a bit line to be connected to the sense amplifier among the bit lines.

9. The device of claim 1, further comprising a multiplexer provided between the bit lines and the sense amplifier, the multiplexer being configured to connect a bit line selected from the bit lines to the sense amplifier, wherein
 during a data read operation or a data write operation, the multiplexer changes the bit line to be connected to the sense amplifier in a second memory segment among the memory segments when read data from a first memory segment among the memory segment is output from the input/output part or when write data to the first memory segment is input to the input/output part.

10. The device of claim 9, wherein during a data read operation or a data write operation, the multiplexer changes the bit line to be connected to the sense amplifier in the first memory segment when read data from the second memory segment is output from the input/output part or when write data to the second memory segment is input to the input/output part.

11. The device of claim 9, wherein during a data read operation or a data write operation, the decoder fixes a local word line to be selected from the local word lines.

12. The device of claim 10, wherein during a data read operation or a data write operation, the decoder fixes a local word line to be selected from the local word lines.

13. A driving method of a semiconductor storage device, the device comprising: a plurality of local word lines; a plurality of bit lines intersecting the local word lines; a plurality of memory segments each including a plurality of nonvolatile memory cells provided to correspond to intersections between the local word lines and the bit lines, each of the memory segments being provided to correspond to a plurality of the local word lines; a sense amplifier provided to correspond to a plurality of the bit lines; a global word line provided to correspond to a plurality of the local word lines, the global word line being configured to be commonly driven in the memory segments; a decoder connected between the global word line and the local word lines corresponding to the global word line, and configured to selectively drive a certain local word line from the local word lines; a segment controller provided in each of the memory segments, and configured to select one of the memory segments to be driven; an input/output part configured to output read data from the memory segments or to receive write data to the memory segments; and an address register configured to receive a global address designating the global word line, a local address designating one of the local word lines, and a segment address designating one of the memory segments from the input/output part and to temporarily hold the global address, the local address, and the segment address,
 the method comprising:
 selecting a certain memory segment from the memory segments based on the segment address, and independently operating the segment controller corresponding to the selected memory segment;
 in the selected memory segment, selectively driving a certain local word line from the local word lines based on the global address and the local address; and
 changing the local word line selected in a second memory segment among the memory segments without changing the global word line selected in the second memory segment, when read data from a first memory segment among the memory segments is output from the input/output part during a read operation in which the sense amplifier reads out a certain page data.

14. The method of claim 13, further comprising changing the local word line selected in a second memory segment among the memory segments when write data to the first memory segment is input to the input/output part during a data write operation.

15. The method of claim 14, further comprising changing the local word line selected in the first memory segment when read data from the second memory segment is output from the input/output part or when write data to the second memory segment is input to the input/output part.

16. The method of claim 13, wherein a bit line connected to the sense amplifier among the bit lines is fixed during a data read operation or a data write operation.

17. The device of claim 1, wherein an active command issued in the read operation of the page data includes an upper active command for selection of the global word line and a lower active command for selection of the local word line.

18. The device of claim 17, wherein a page space of a first page data read by a certain active command is different from a second page space of a second page data read by another active command.

* * * * *